(12) United States Patent
Wilkie et al.

(10) Patent No.: US 7,613,990 B1
(45) Date of Patent: Nov. 3, 2009

(54) METHOD AND SYSTEM FOR A MULTI-CHANNEL ADD-COMPARE-SELECT UNIT

(75) Inventors: William A. Wilkie, Edinburgh (GB); David I. Lawrie, Heriot (GB); Elizabeth R. Cowie, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 1514 days.

(21) Appl. No.: 10/717,042

(22) Filed: Nov. 18, 2003

(51) Int. Cl.
*H03M 13/00* (2006.01)
*G06F 11/00* (2006.01)
*G01R 31/30* (2006.01)

(52) U.S. Cl. .................... 714/796; 714/798; 714/745

(58) Field of Classification Search ............... None
See application file for complete search history.

(56) References Cited

U.S. PATENT DOCUMENTS 6,813,744 B1* 11/2004 Traeber ................ 714/795
7,046,747 B2* 5/2006 Vasquez ................ 375/341
7,458,008 B2* 11/2008 Wang et al. ............ 714/796

OTHER PUBLICATIONS

Xilinx, Inc., *Viterbi Decoder v3.0*, DS247 (v1.0), Mar. 28, 2003, pp. 1-24, available from Xilinx, Inc., San Jose, California, USA.
Xilinx, Inc., *Viterbi Decoder v6.2*, DS247, Oct. 10, 2007, pp. 1-33, available from Xilinx, Inc., San Jose, California, USA.

* cited by examiner

*Primary Examiner*—Christine T Tu
(74) *Attorney, Agent, or Firm*—Samuel G. Campbell; Michael T. Wallace

(57) ABSTRACT

A circuit for a multi-channel add-compare-select unit is disclosed. The circuit includes a compare unit and a datapath. The datapath is coupled to the compare unit, and includes a number of adder units, a selection unit (which is coupled to the adder units), and a number of clocked storage stages.

22 Claims, 9 Drawing Sheets

METHOD AND SYSTEM FOR A MULTI-CHANNEL ADD-COMPARE-SELECT UNIT

BACKGROUND OF THE INVENTION

1. Field of the Invention

This invention relates to the field of error correction, and more particularly relates to a method and system for a multi-channel add-compare-select unit.

2. Description of the Related Art

The "Add-Compare-Select" (ACS) circuit is a well-known building block for a variety of circuits, including circuits such as the Forward Error Correction (FEC) circuit. The ACS circuit (ACS unit) forms the basis of most convolutional/trellis decoders, as well as comparable circuits. The basic function of an ACS unit is to add its inputs together in some combination, compare the results of those additions, and in doing so, select one of those results as the ACS unit's output.

The function of an ACS unit in a trellis decoder can be used as an example. In the simplest terms, an ACS unit implemented in a trellis decoder takes the cost of each branch into a state within the trellis, and adds the total cost of the source state for that branch. This results in two new state costs (e.g., A and B). These two new state costs are then compared to one another, and the smaller cost of the two is selected (e.g., B<A?). This selected cost is output as the new cost for the current state under consideration. An FEC design may contain hundreds of such ACS units. The output of each of these ACS units feeds back into itself, or to the inputs of another of the ACS units. The ACS units' operation needs to execute in a single symbol period in order to successfully process the incoming data stream. Thus, the ACS unit typically forms the critical timing path within a design employing such circuits (e.g., an FEC design).

FIG. 1 is an example of such an "add-compare-select" (ACS) unit 100 of the prior art. ACS unit 100 includes two adder units (depicted in FIG. 1 as an adder unit 110 and an adder unit 120). Adder unit 110 takes as its input a previous state A cost signal 112 and a branch cost A signal 114. Similarly, adder unit 120 takes as its inputs a previous state B cost signal 122 and a branch cost B signal 124. The outputs of adder units 110 and 120 are fed into a selection circuit 130 and a compare unit 140. The output of selection circuit 130 is stored in a register 150, and upon such storage, appears at an output of register 150 as a new cost signal 155.

As noted, the output of adder units 110 and 120 are also provided to compare unit 140. The output of adder unit 110 is received by compare unit 140 at an input A. Similarly, the output of adder unit 120 is received by compare unit 140 at an input B. Compare unit 140 uses this information to make a determination as to whether the output of adder unit 110 is less than the output of adder unit 120 (depicted in FIG. 1 as an output B<A), and in so doing, for example, determines the smaller of the two new state costs output by adder units 110 and 120.

The output of compare unit 140 is provided to selection unit 130 as a select signal 145. Select signal 145 causes selection unit 130 to select either the output of adder unit 110 or the output of adder unit 120, depending on the outcome of the determination just described. Select signal 145 is also provided to a register 160, which stores select signal 145. Upon storage, this information appears at the output of register 160 as a path selection signal 165.

Similar to the standard ACS unit, the "Add-Compare-Select-Offset" (ACSO) unit operates in a similar manner, with the exception that in an ACSO unit, the larger sum generated is chosen, and a small offset added to that result. Such an architecture is used, for example, in the design of turbo-convolutional decoders, which are an implementation of an advanced Forward Error Correction (FEC) algorithm commonly used in wireless data communications.

FIG. 2 is a block diagram illustrating an architecture of an ACSO unit 200 according to the prior art. As will be appreciated, the architecture of ACSO unit 200 is similar in many respects to that of ACS unit 100 of FIG. 1. In this case, an adder unit 210 takes as its input a previous state A likelihood (PSAL) signal 212 and a branch likelihood A (BLA) signal 214, producing a sum of these two signals. Similarly, an adder unit 220 generates the sum of a previous state B likelihood (PSBL) signal 222 and a branch likelihood B (BLB) signal 224.

Also as before, a selection unit 230 receives these sums (i.e., the outputs of adder units 210 and 220), and selects one of these sums under the control of a compare unit 240. Compare unit 240 receives the sum generated by adder unit 210 at an input A, and receives the sum generated by adder unit 220 at an input B. Compare unit 240 controls the selection made by selection unit 230 based on a comparison of the inputs A and B. Thus, the select signal generated by compare unit 240 is based on a determination as to whether the input B is less than the input A (depicted in FIG. 2 as an output B<A).

However, in ACSO unit 200, compare unit 240 is also configured to generate the difference between input A and input B (depicted in FIG. 2 as an output A-B). This difference is provided as an address to a read-only memory (ROM) 250, or other such storage device. ROM 250 stores offsets that provide the offsets necessary to compute the new likelihood ratio. The outputs of selection unit 230 and ROM 250 are summed by an adder unit 260 to generate a new likelihood value. This new likelihood value is clocked into a register 270, and appears at an output of register 270 as a new likelihood signal 280.

As will be appreciated, it is not uncommon in today's communication systems to have multiple incoming channels. In such a situation, each of these channels needs to be decoded. This has historically been addressed by replicating the decoder circuit once for each additional channel. As will be appreciated, this replication increases the cost of such circuitry, as well as the area consumed. An example of such an architecture is now given.

FIG. 3 is a block diagram depicting a multiple channel architecture 300 of the prior art. Multiple channel architecture 300 includes a number of ACS units (depicted in FIG. 3 as ACS units 310(1)-(N), where N is an integer). Each of ACS units 310(1)-(N) receives an input signal (depicted in FIG. 3 as input signals 320(1)-(N)), representing one of a number of channels of cost data (shown in FIG. 3 as channels 1-N cost data). Correspondingly, each of ACS units 310(1)-(N) generates an output signal (depicted in FIG. 3 as output signals 330(1)-(N)), representing one of a number of channels' new cost data and path selections (shown in FIG. 3 as channels 1-N new cost data and path selections). As will be appreciated, each channel is presented to one of ACS units 310(1)-(N), which performs the requisite decoding, according to the coding/decoding (codec) scheme employed. As will also be appreciated, a multi-channel turbo-convolutional scheme can be implemented by replacing each of ACS units 310(1)-(N) with an ACSO unit.

Such an architecture is not without its limitations, however. While providing for the processing of multiple channels, the usefulness of such an approach is limited by the resources consumed thereby. This is particularly true of the integrated circuit area required by such an architecture. Moreover, while throughput is much improved over a single channel implementation as a result of multiple channels being processed, each ACS unit is still limited to processing a single symbol per symbol time, limiting the architecture's overall throughput. On a per-channel basis, the architecture's throughput is thus no different than that of the single channel implementation. Frequency of operation is similarly restricted, which may result in a substantial portion of a hardware implementation's bandwidth going unused.

What is therefore desired is an ACS/ACSO circuit that is capable of processing multiple data channels. Preferably, such an ACS/ACSO circuit should provide such capabilities with a minimal increase in circuit size as compared to a standard ACS/ACSO circuit. It is also preferable that such a circuit be capable of operating at clock speeds significantly higher than a standard ACS/ACSO circuit.

SUMMARY

In one embodiment, a circuit for a multi-channel add-compare-select unit is disclosed. The circuit includes a compare unit and a datapath. The datapath is coupled to the compare unit, and includes a number of adder units, a selection unit (which is coupled to the adder units), and a number of clocked storage stages.

In another embodiment, a method is disclosed. The method includes producing a first sum, producing a second sum and producing a selected sum by selecting one of the first sum and the second sum. The first sum is produced from first data received at a first input of a number of inputs and second data received at a second input of the inputs. The a second sum is produced from third data received at a third input of the inputs and fourth data received at a fourth input of the inputs. Once produced, the selected sum is provided at an output. The method also includes performing a number of clocked storage operations on a signal, is conveyed on a signal path between a one of the inputs and the output.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and numerous objects, features, and advantages made apparent to those skilled in the art by referencing the accompanying drawings.

The use of the same reference symbols in different drawings indicates similar or identical items.

DETAILED DESCRIPTION OF THE INVENTION

The following is intended to provide a detailed description of an example of the invention and should not be taken to be limiting of the invention itself. Rather, any number of variations may fall within the scope of the invention which is defined in the claims following the description.

Introduction

The invention provides a method and system for a multi-channel ACS (or ACSO) unit. A multiple-channel ACS (MCACS) or multiple-channel ACSO (MCACSO) unit of the present invention provides a mechanism for efficiently processing multiple-channel data at a high throughput rate.

An MCACS/MCACSO of the present invention is able to process multiple channels through its use of an interlaced multiple-channel data signal and pipelining the processing thereof. Such an MCACS/MCACSO unit employs multiple clocked storage stages to store the intermediate results of the operations performed by the MCACS/MCACSO unit. These clocked storage stages can be included at any point within the datapath from the MCACS/MCACSO unit's input to its output, including within the elements of the MCACS/MCACSO unit, as well as between such elements. As will be appreciated, the signals flowing through the MCACS/MCACSO unit need to be stored (or gated) at comparable points within the MCACS/MCACSO unit, to ensure that these signals are in synchrony (i.e., arrive at their destination within the MCACS/MCACSO unit at the appropriate point in time).

The present invention provides a number of advantages. Among them is the ability to operate on multiple data channels, while not consuming significantly more resources in implementation. Another advantage is the ability to operate at a higher frequency, and so a higher throughput rate, than standard techniques.

Example ACS Circuits and Operation Thereof

Figure 1:
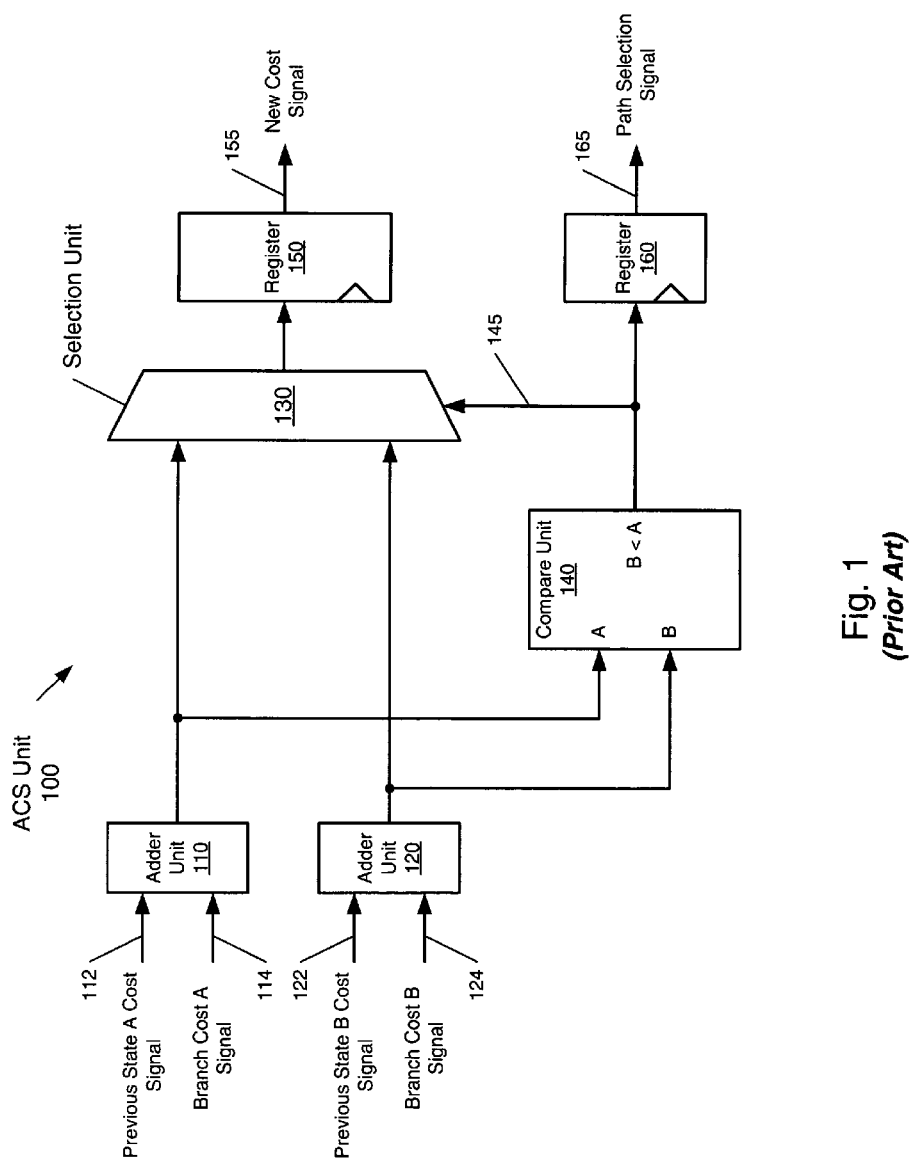
FIG. 1 is a block diagram illustrating an example of an add-compare-select unit of the prior art.
Figure 2:
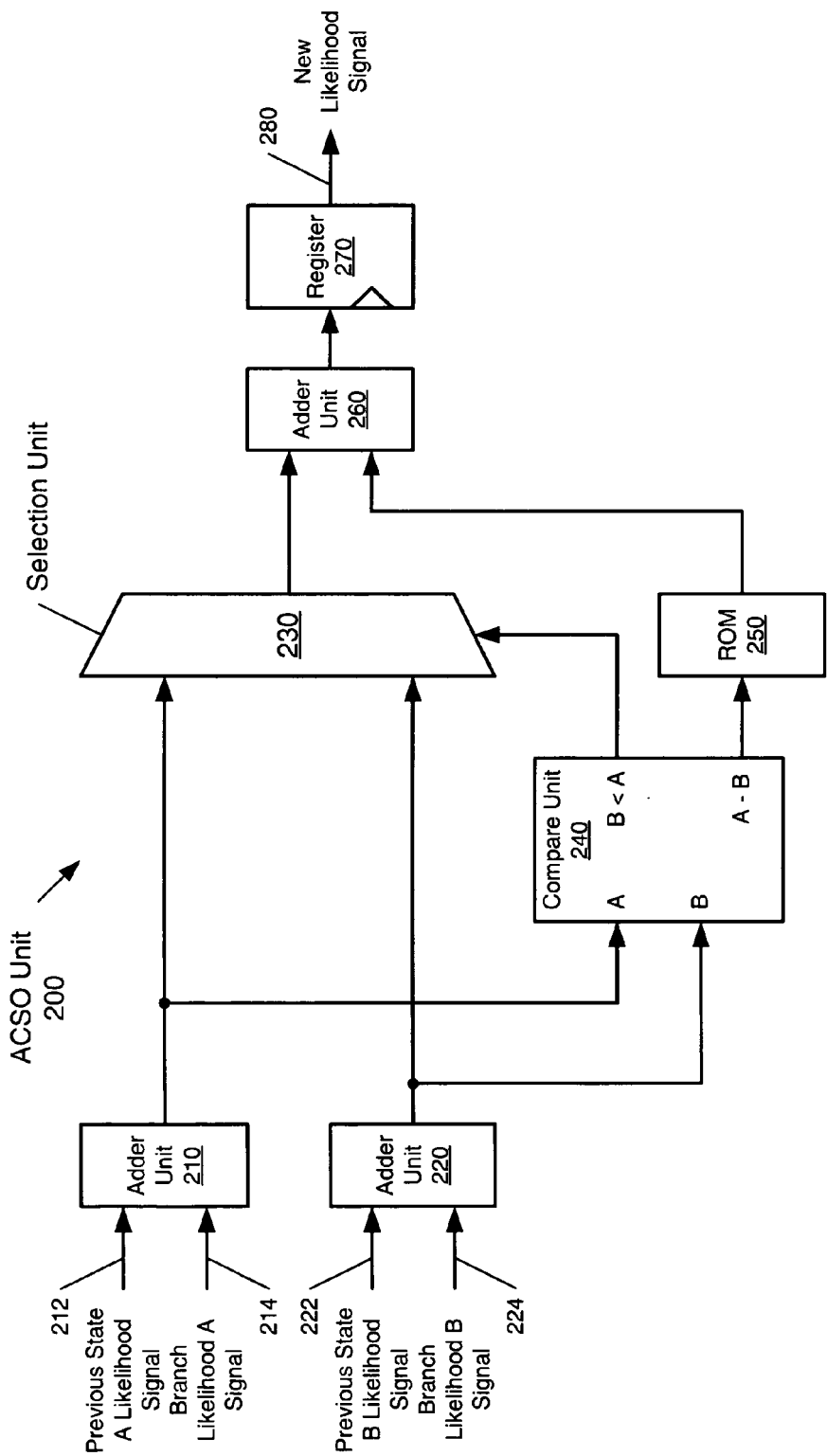
FIG. 2 is a block diagram illustrating an example of a ROM-based add-compare-select-offset unit of the prior art.
Figure 4:
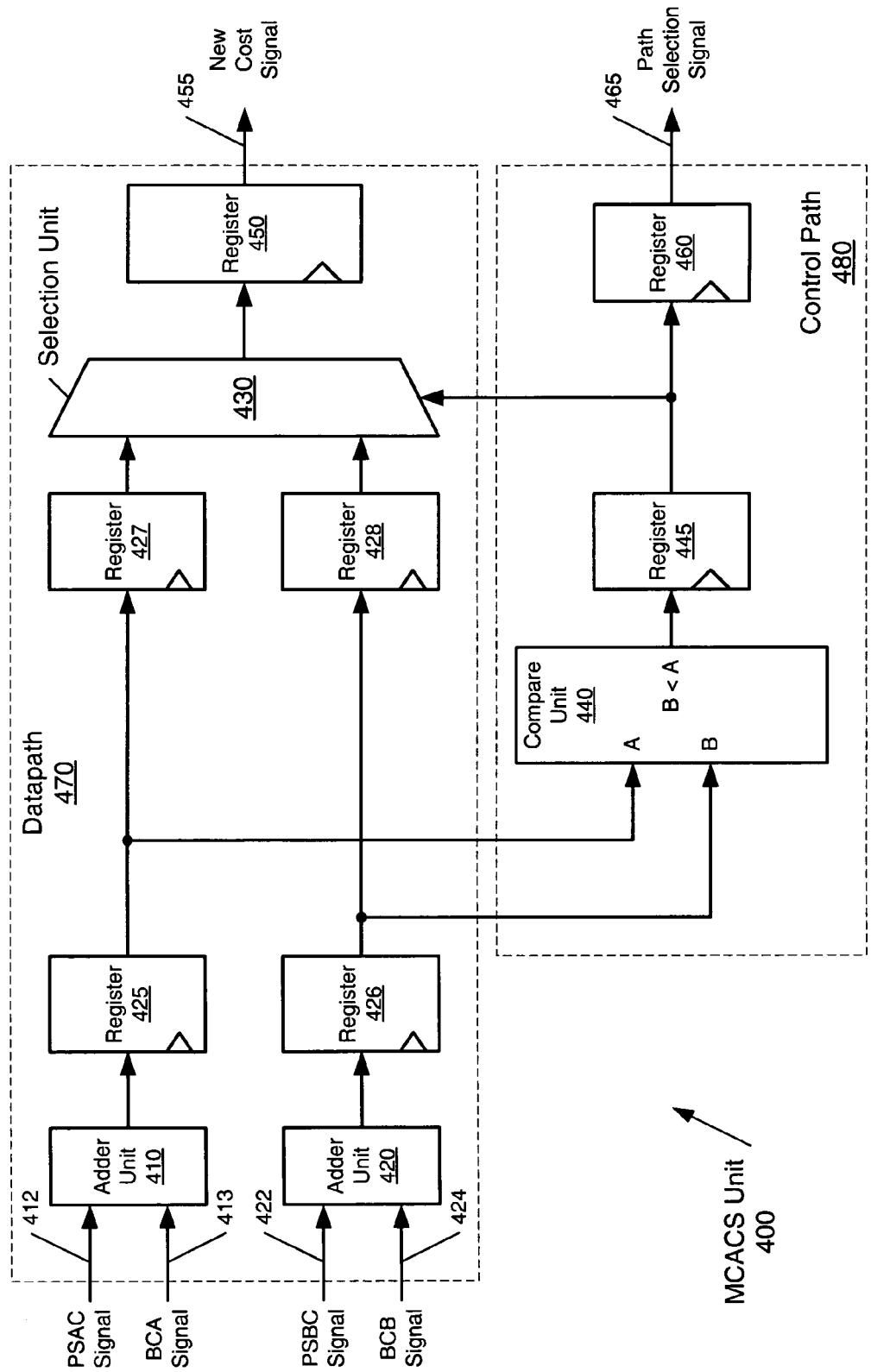
FIG. 4 is a block diagram illustrating an example of an add-compare-select unit according to embodiments of the present invention.

FIG. 4 is a block diagram of an example of a multiple channel ACS (MCACS) unit 400 according to the present invention. MCACS unit 400 includes an adder unit 410 that receives a previous state A cost (PSAC) signal 412 and a branch cost A (BCA) signal 414, and generates a sum of these two signals. Similarly, an adder unit 420 receives a previous state B cost (PSBC) signal 422 and a branch cost B (BCB) signal 424, and generates a sum of these two signals. This occurs in the manner of the additions performed by ACS unit 100 of FIG. 1. It will be appreciated, however, that in certain circumstances, adder units 410 and 420 actually implement other operations, such as subtraction (in effect, the addition of one operand with the negative of another operand), multiplication (in effect, repeated addition), logical shifting (which can effect multiplication or division) and the like. Such alternatives are contemplated by the structures described, and the elements claimed, herein.

However, in the example depicted in FIG. 4, the sums generated by adder units 410 and 420 are then fed into clocked storage stages. Such clock storage stages are depicted in FIG. 4 as registers 425 and 426. As will be appreciated by those of skill in the art, such clock storage stages can be implemented in a variety of ways, and the use of registers in FIG. 4 (as well as other figures herein) is merely an example of such alternatives, which includes registers, shift registers, aggregations of flip-flops, RAM-based delay lines and other such constructs, and is provided to allow for familiarity in discussing such elements. It will also be appreciated that, in a more general sense, such clock storage stages can be aggregated, and viewed as a slice or plane through the data and control paths of the given MCACS/MCACSO unit. Such a plane intersects the signal paths at a point at which those signals passing therethrough can be stored/gated while having their synchrony maintained (though their progress through the MCACS/MCACSO unit is momentarily interrupted).

Registers 425 and 426 clock in the sums generated by adders units 410 and 420, respectively, providing those values on their respective outputs and maintaining them for a predetermined period of time. In doing so, the use of registers 425 and 426 allows the inputs to adders units 410 and 420 to change (e.g., as would occur upon the receipt of the next channel's data in a system of the present invention) without resulting in changing the signals presented to the next set of registers.

The outputs of registers 425 and 426 are then provided to those registers, registers 427 and 428, respectively. As with registers 425 and 426, registers 427 and 428 clock in a given channel's data, allowing the preceding stage to accept the subsequent channel's data. Registers 427 and 428 provide their outputs to a selection unit 430. The outputs of registers 425 and 426 are also provided to a compare unit 440. Compare unit 440 receives the output of register 425 (i.e. the sum generated by adder unit 410) at an input A. Similarly, compare unit 440 receives the output of register 426 (i.e., the sum generated by adder unit 420) at an input B. Compare unit 440 compares input A with input B, and makes a determination as to whether input B is less than input A (i.e., B<A). The results of this comparison are used as a select signal to control which sum is selected by selection unit 430.

It is also advantageous to break up the path from the outputs of registers 425 and 426, through compare unit 440, to selection unit 430. In the example shown in FIG. 4, this is accomplished by coupling a register 445 between compare unit 440 and selection unit 430 (i.e., clocking the aforementioned select signal), and so decoupling the time required for the signals to propagate through compare unit 440 and through selection unit 430. This arrangement thus reduces the delay encountered between clocked storage stages by signals traversing this signal path (by including another clocked storage stage in that path), and so provides an increase in processing speed. However, the sums corresponding to this select signal (from registers 425 and 426) also need to be clocked through a clocked storage stage in order to remain in synchrony with the select signal. Thus, rather than providing the sums from registers 425 and 426 directly to selection unit 430, the sums are clocked into registers 427 and 428, in order to maintain the signals in synchrony. Thus, registers 427 and 428 are coupled between registers 425 and 426, respectively, and selection unit 430, in order to allow the sums to be provided to selection unit 430 at the appropriate time. As will be appreciated, registers 427, 428 and 445 can, in fact, be included at appropriate points within selection unit 430, as one or more clock storage stages therein.

Once this selection signal is provided to selection unit 430 and an appropriate one of the sums presented by registers 427 and 428 is selected, the selected sum is provided to a register 450 and consequently output as a new cost signal 455. In a similar manner, the select signal generated by compare unit 440 and stored by register 445 is clocked into a register 460, for subsequent presentation as a path selection signal 465.

As will be appreciated, adder units 410 and 420, registers 425-428, selection unit 430 and register 450 make up a datapath 470 of MCACS unit 400, while compare unit 440 and registers 445 and 460 make up a control path 480 of MCACS unit 400. In general, clocked storage stages can be inserted into datapath 470 at any point between its inputs and its outputs. This includes inserting clocked storage stages within the outer units, selection unit or in between such elements. This also holds true for the insertion of clocked storage stages within control path 480 (e.g., a clocked storage stage can be inserted within compare unit 440, for example).

However, in the manner previously noted, for each clocked storage stage inserted after the point at which control path 480 is coupled to datapath 470, a clocked storage stage inserted in datapath 470 will mandate the insertion of a corresponding clocked storage stage within control path 480. Ultimately, the need is to provide a given channel's data to the various elements of datapath 470 and control path 480, such that data and control signals are present and stable at corresponding points in datapath 470 and control path 480, and such that the outputs generated thereby are good for a period of time sufficient to allow MCACS unit 400 to operate properly.

AS will be appreciated, other components of a FEC decoder employing MCACS units of the present invention should be modified to allow processing of the interlaced channel data from the MCACS unit. Typically, this simply involves adding an extra pipeline register for each channel in the FEC decoder. As will be appreciated, in memory-based FPGA's, such constructs can be created without consuming significantly more area of the FPGA.

Regarding the signals described herein, those skilled in the art will recognize that a signal may be directly transmitted from a first block to a second block, or a signal may be modified (e.g., amplified, attenuated, delayed, buffered, inverted, filtered or otherwise modified) between the blocks. Although the signals of the above described embodiment are characterized as transmitted from one block to the next, other embodiments of the present invention may include modified signals in place of such directly transmitted signals as long as the informational and/or functional aspect of the signal is transmitted between blocks. To some extent, a signal input at a second block may be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

The foregoing described embodiment wherein the different components are contained within different other components (e.g., the various elements shown as components of MCACS 400). It is to be understood that such depicted architectures are merely examples, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "[operably] connected", or "[operably] coupled", to each other to achieve the desired functionality.

Figure 5:
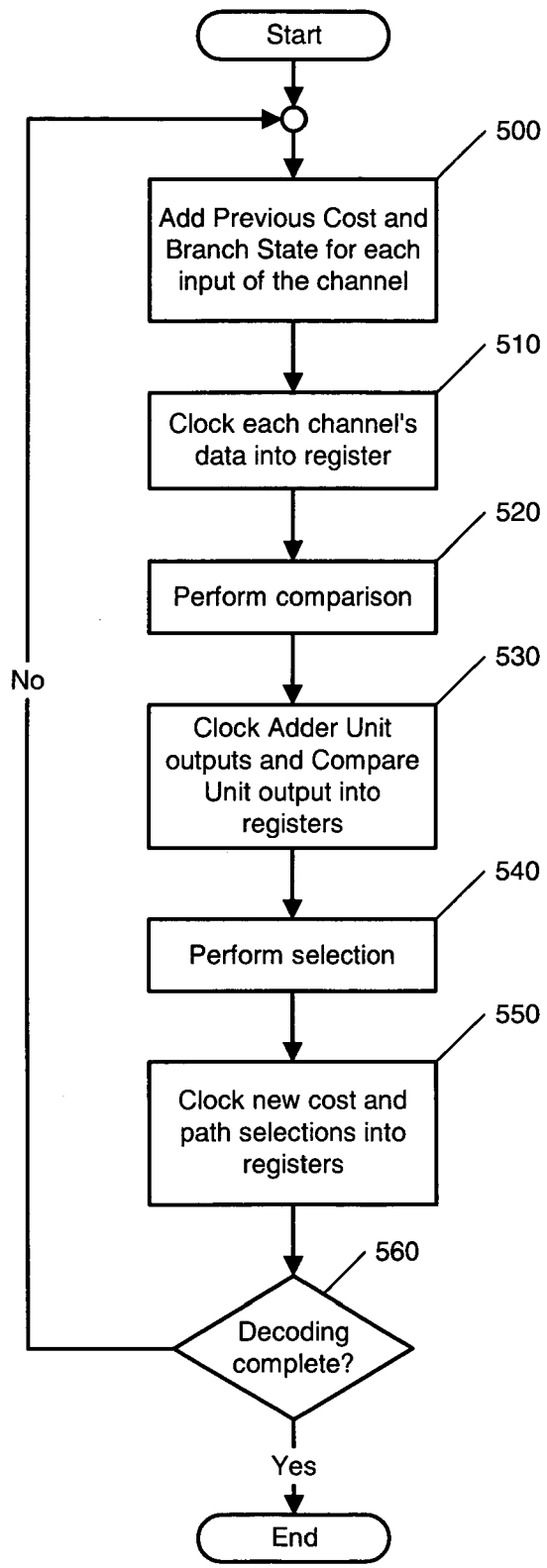
FIG. 5 is a flow diagram illustrating an example of the operation of the add-compare-select unit of FIG. 4.

FIG. 5 is a flow diagram illustrating the operation of MCACS unit 400. The process begins with the addition of previous costs and branch states for each input (input A and input B, in FIG. 4) of the given channel (i.e., the channel currently being received) (step 500). Next, the given channel's data is clocked into its respective register (e.g., registers 425 and 426) (step 510), or other clocked storage stage(s) as may be used. With this data being presented on the output of registers 425 and 426, compare unit 440 is able to perform the requisite comparison (step 520).

Next, the outputs of registers 425 and 426, as well as the output of compare unit 440, are clocked into registers 427, 428, and 445, respectively (step 530). With the sums generated by adder units 410 and 420 now present at the outputs of registers 427 and 428, and the results of the comparison performed by compare unit 440 presented at the output of register 445, selection unit 430 is now able to select one of the sums based on the select signal it has received (step 540). With the selection now made, the selected sum is clocked into register 450 and so presented as new cost signal 455 (step 550). Similarly, the result of the comparison performed by comparison unit 440 is clocked in register 460, and presented as path selection signal 465 (step 550).

Control circuitry (not shown) then makes a determination as to whether the decoding being performed is complete (i.e., whether all data from each of the channels has completed processing) (step 560). If decoding is complete, the process is at an end. If further processing is required, the process loops back to the beginning, and the channel's data is processed further.

As noted, FIG. 5 depicts a flow diagram illustrating a process according to an embodiment of the present invention. It is appreciated that operations discussed herein may consist of directly entered commands by a computer system user or by steps executed by application specific hardware modules. The functionality of steps referred to herein may correspond to the functionality of modules or portions of modules.

The operations referred to herein may be modules or portions of modules (e.g., software, firmware or hardware modules). For example, while the described embodiment includes field-programmable application specific hardware modules, the various example modules may be software modules and/or include manually entered user commands. The software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into submodules to be executed as multiple computer processes, and, optionally, on multiple computers. Moreover, alternative embodiments may combine multiple instances of a particular module or submodule. Furthermore, those skilled in the art will recognize that the operations described in example embodiment are for illustration only. Operations may be combined or the functionality of the operations may be distributed in additional operations in accordance with the invention.

Alternatively, such actions may be embodied in the structure of circuitry that implements such functionality, such as the micro-code of a complex instruction set computer (CISC), firmware programmed into programmable or erasable/programmable devices, the configuration of a field-programmable gate array (FPGA), the design of a gate array or full-custom application-specific integrated circuit (ASIC), or the like.

The example depicted in FIG. 4 processes three channels of data concurrently. The operation of such an MCACS relies on the fact that the incoming data for the three channels are interlaced. For example, in the scenario where three data channels are used, data is provided to the MCACS unit in the sequence described below in connection with FIG. 6.

Figure 6:
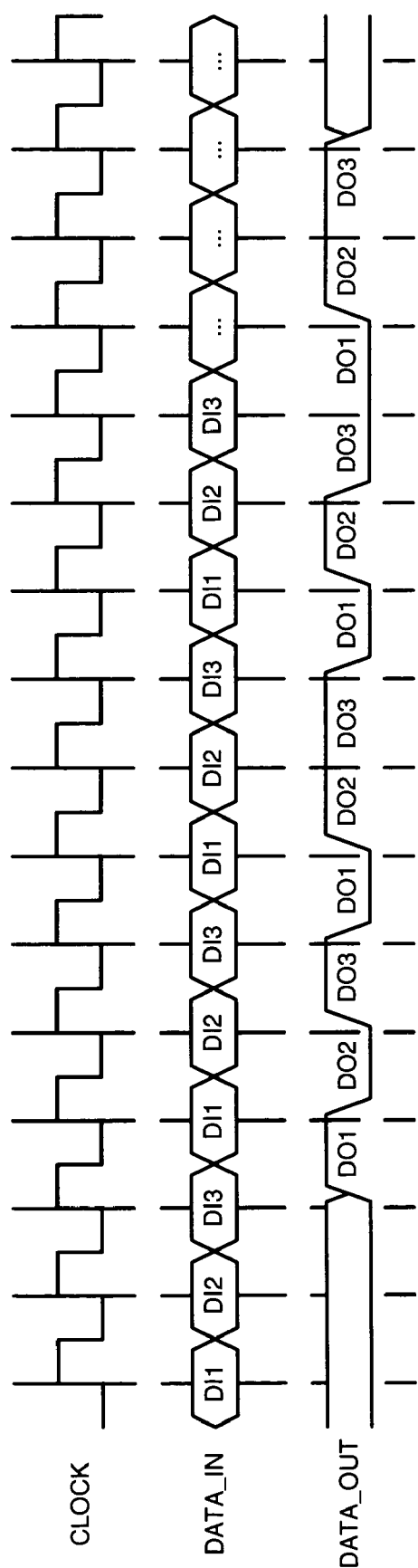
FIG. 6 is a timing diagram illustrating an example of the operation of the add-compare-select unit of FIG. 4.

FIG. 6 is a timing diagram illustrating an example of the operation of an MCACS unit such as MCACS unit 400. FIG. 6 shows data at the inputs and outputs of such an MCACS unit. It will be appreciated that the sequential relationship depicted in FIG. 6 with regard to DATA_IN and DATA_OUT would also apply to the primary inputs and outputs of an overall convolutional decoder design employing such an MCACS unit. In that case, however, a much greater delay would be observed between a channel's data being input to such a decoder and the corresponding decoded data being output therefrom.

As can be seen, DATA_IN (the input data) includes three channels of data (depicted as DI1, DI2 and DI3), each interlaced in one another in a sequential fashion. It will be appreciated that the input data depicted in FIG. 6 (and subsequently, in FIG. 8) is intended to represent a vector of inputs, as the actual number of inputs depends on the type of error correction algorithm implemented. The same waveforms and relationships apply to each individual MCACS unit. The data for channels one, two, and three (i.e., DI1, DI2 and DI3), are fed sequentially into the MCACS unit in an interlaced order. As will also be appreciated, because the data inputs are interlaced in this fashion, the data output by an MCACS unit of the present invention will be similarly interlaced (as shown in FIG. 6 by DATA_OUT).

Data for the channels is thus received in sequential order, and proceeds through the given MCACS unit in that order. At any given time, then, clocked storage stages at various points within the MCACS unit each hold the data for a given channel (e.g., the clocked storage stages of MCACS 400 store the data of channels one, two or three). After the next clock edge, the data for each channel proceeds to the next clocked storage stage(s). As will be apparent, if the clocked storage stage is the last such stage in the MCACS unit, the channel's data is available at the MCACS unit's output, and so would either be clocked into the same MCACS unit, another MCACS unit, or output from the decoder. This can be seen in FIG. 6, where the use of three clocked storage stages results in a given channel's data being available on the MCACS unit's output every three clock cycles. It will also be noted that the channel's data is thus also available at that time (and, as would be expected, in time) to be clocked into the next MCACS unit (whether the original MCACS unit, or a different one), or output from the decoder.

It will be noted that three clock cycles are required in this example in order to compute the new cost values for all three channels. However, the clock can be run significantly faster than would otherwise be possible, because the feedback loop (and so the time required to get from one stage to another) has been divided into three portions. Thus, a single MCACS unit is capable of performing the same operations as multiple standard ACS units run independently on the given number of channels (in this example, three channels).

An MCACS unit (or MCACSO unit) of the present invention is particularly amenable to implementation using memory-based field-programmable gate arrays (FPGA's), because the MCACS unit is not significantly larger than the implementation of a standard ACS unit. This is because the extra registers employed in an MCACS unit are absorbed by the spare register capacity with the FPGA's configurable logic blocks (CLB's) implementing the adders and other logic of the MCACS.

Figure 3:
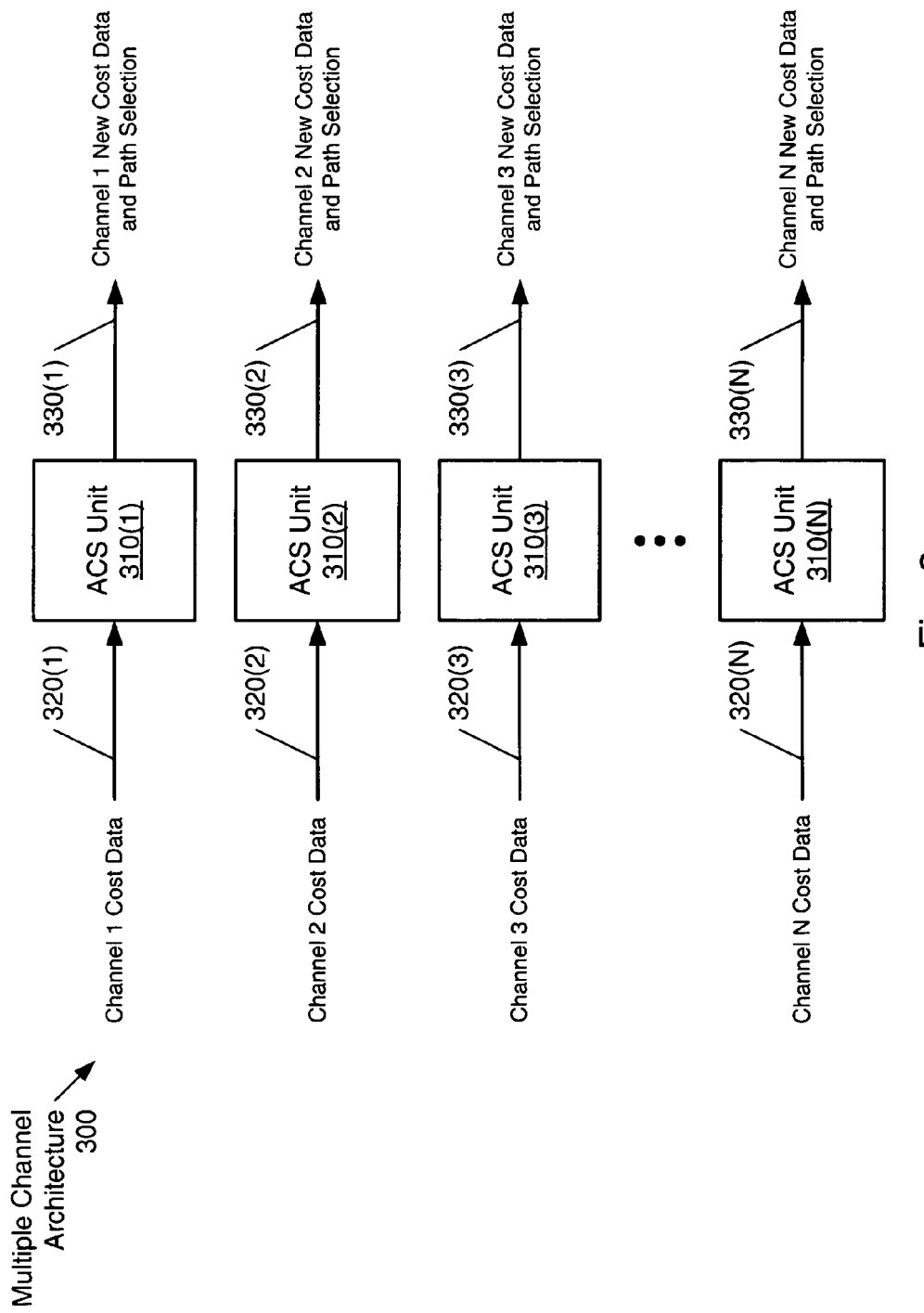
FIG. 3 is a block diagram illustrating a multiple channel architecture of the prior art.

It will be appreciated that, in implementations according to the present invention, the combinatorial path of the standard ACS unit is split into multiple portions in the MCACS unit (e.g., being split into three portions by the addition of two clocked storage stages, in the example presented previously). Breaking the standard ACS unit into stages permits the MCACS unit to operate at significantly higher clock frequencies than a standard ACS unit. However, the total throughput through an MCACS unit will typically be somewhat less than a parallel design (e.g., that of FIG. 3). As will be appreciated, of course, an MCACS unit provides significantly higher throughput than a standard ACS unit, and does so in significantly less area than a parallel design. As will be appreciated, the number of data channels that an MCACS unit is configured to process is equal to the number of clocked storage stages in the datapath of the MCACS unit.

Another Example ACS Circuit and Operation Thereof

If a number of channels other than three channels is required, then the number of clocked storage stages required will be different, as well. For example, if four or more channels are to be processed, a larger number of clocked storage stages is employed, and arranged at some point within the datapath of the MCACS unit. As will be appreciated, these clocked storage stages can be inserted between elements (e.g., between the adder units and selection unit), within one of these elements (e.g., within the adder units or selection unit), or at some other point. Moreover, if multiple clocked storage stages are employed, constructs such as shift registers or equivalent structures can be employed. Again, in the case of memory-based FPGA's, such banks of clocked storage stages can be implemented using a shift register look-up table (LUT) (SRL), allowing an efficient implementation of the MCACS unit in such an FPGA.

Figure 7:
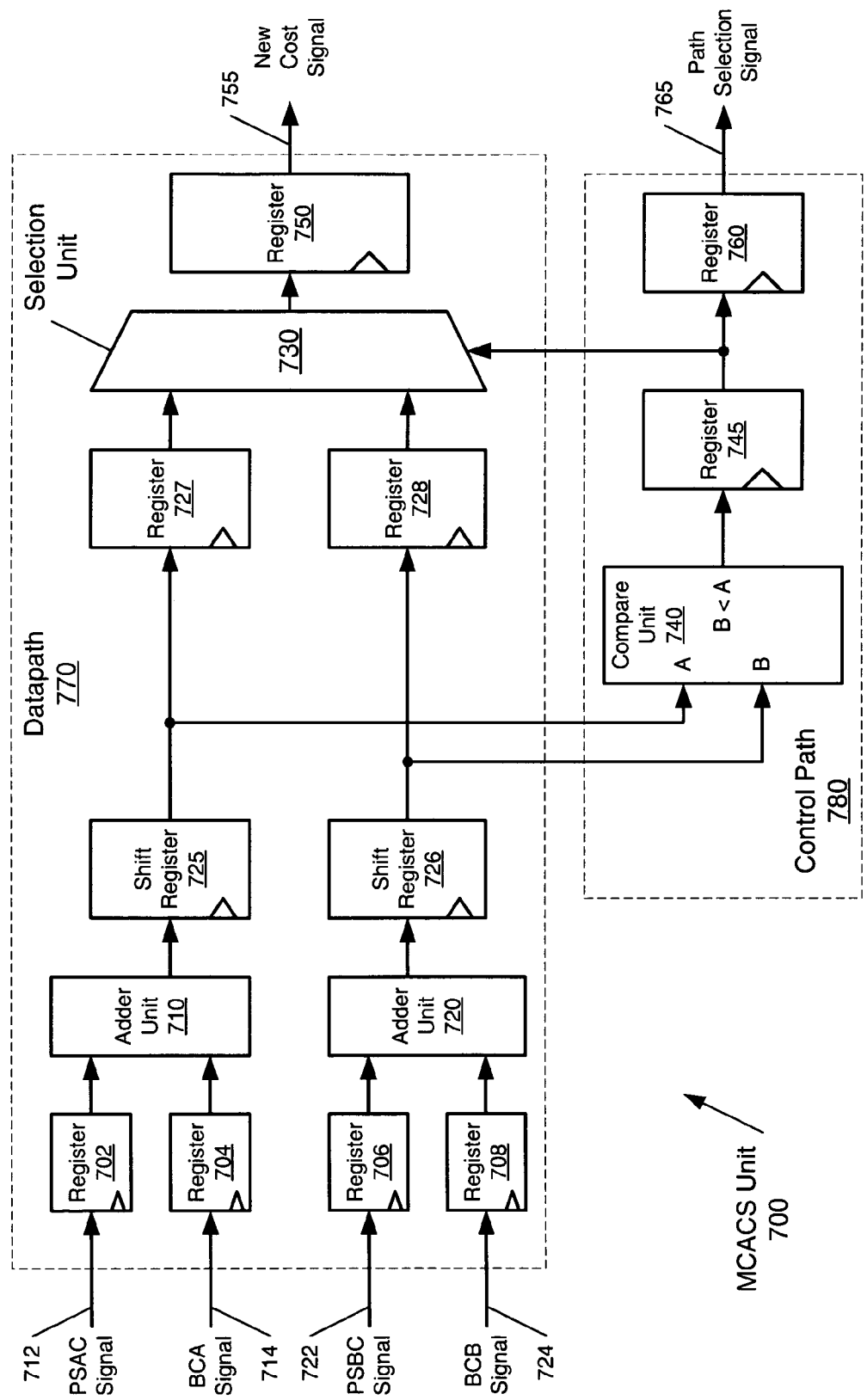
FIG. 7 is a block diagram illustrating an example of another add-compare-select unit according to embodiments of the present invention.

FIG. 7 is a block diagram of an example of a multiple channel ACS (MCACS) unit 700 according to the present invention which is configured to support six channels. As noted, clocked storage stages can be inserted at any appropriate point in the data and control paths of an MCACS unit. MCACS unit 700, for example, includes registers at its inputs (depicted in FIG. 7 as registers 702, 704, 706 and 708), which provide their outputs to an adder unit 710 and an adder unit 720. Adder unit 710 receives, via registers 702 and 704, a PSAC signal 712 and a BCA signal 714, respectively, and generates a sum of these two signals. Similarly, adder unit 720 receives, via registers 706 and 708, a PSBC signal 722 and a BCB signal 724, and generates a sum of these two signals. This occurs in the manner of the additions performed by MCACS unit 400 of FIG. 4.

In a manner similar to FIG. 4, the sums generated by adder units 710 and 720 are then fed into clocked storage stages. However, such clock storage stages are depicted in FIG. 7 as shift registers 725 and 726 (rather than registers). Shift registers 725 and 726 are three bits in length in this example (although shift registers of other lengths could be employed, so long as an appropriate number of clock storage stages is maintained within MCACS unit 700). Shift registers 725 and 726 clock in the sums generated by adder units 710 and 720, respectively, and shift those values through their structures. Ultimately, after three clock cycles, shift registers 725 and 726 provide these values on their respective outputs and maintain them there for a predetermined period of time.

The outputs of shift registers 725 and 726 are then provided to registers 727 and 728, respectively. As with registers 725 and 726, registers 727 and 728 clock in a given channel's data, allowing the preceding stage to accept a subsequent channel's data at the preceding stage's inputs. Registers 727 and 728 provide their outputs to a selection unit 730. The outputs of registers 725 and 726 are also provided to a compare unit 740. Compare unit 740 receives the output of register 725 (i.e. the sum generated by adder unit 710) at an input A. Similarly, compare unit 740 receives the output of register 726 (i.e., the sum generated by adder unit 720) at an input B. Compare unit 740 compares input A with input B, and makes a determination as to whether input B is less than input A (i.e., B<A). The results of this comparison are used as a select signal to control which sum is selected by selection unit 730.

However, the sums corresponding to this select signal will be clocked into registers 727 and 728, and so not provided directly to selection unit 730. That being the case, a register is required, in this example, between compare unit 740 and the select input of selection unit 730, in order to maintain the signals in synchrony. Thus, a register 745 is coupled between compare unit 740 and selection unit 730, allowing the select signal generated by compare unit 740 to be provided to selection unit 730 at the appropriate time.

Once this selection signal is provided to selection unit 730 and an appropriate one of the sums presented by registers 727 and 728 is selected, the selected sum is provided to a register 750 and consequently output as a new cost signal 755. In a similar manner, the select signal generated by compare unit 740 and stored by register 745 is clocked into a register 760, for subsequent presentation as a path selection signal 765.

As will be appreciated, adder units 710 and 720, registers 725-728, selection unit 730 and register 750 make up a datapath 770 of MCACS unit 700, while compare unit 740 and registers 745 and 760 make up a control path 780 of MCACS unit 700. As noted earlier, in general, clocked storage stages can be inserted into datapath 770 at any point between its inputs and its outputs. This includes inserting clocked storage stages within the outer units, selection unit or in between such elements. This also holds true for the insertion of clocked storage stages within control path 780 (e.g., a clocked storage stage can be inserted within compare unit 740, for example).

However, in the manner previously noted, for each clocked storage stage inserted after the point at which control path 780 is coupled to datapath 770, a clocked storage stage inserted in datapath 770 will mandate the insertion of a corresponding clocked storage stage within control path 780. Ultimately, the need is to provide a given channel's data to the various elements of datapath 770 and control path 780, such that data and control signals are present and stable at corresponding points in datapath 770 and control path 780, and such that the outputs generated thereby are good for a period of time sufficient to allow MCACS unit 700 to operate properly. Such operation is exemplified in the discussion below of FIG. 8.

Figure 8:
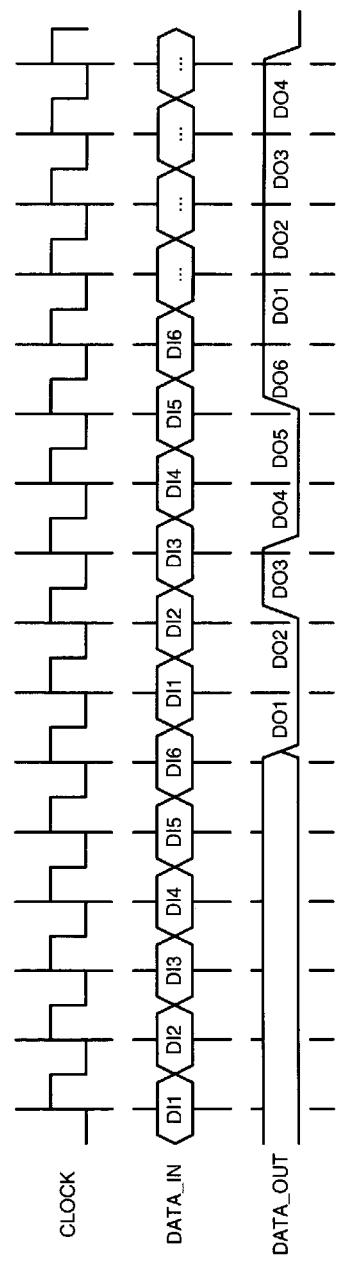
FIG. 8 is a timing diagram illustrating an example of the operation of the add-compare-select unit of FIG. 7.

FIG. 8 is a timing diagram illustrating an example of the operation of an MCACS unit such as MCACS unit 700. FIG. 8 shows data at the primary inputs and outputs of the convolutional decoder design of which the MCACS unit is a part, in the manner of the timing presented in FIG. 8. As can be seen, DATA_IN (the input data) includes six channels of data (depicted as DI1, DI2, DI3, DI4, DI5 and DI6), each interlaced in one another in a sequential fashion. The same waveforms and relationships apply to each individual MCACS unit. The data for channels one, two, three, four, five and six (i.e., DI1, DI2, DI3, DI4, DI5 and DI6), are fed sequentially into the MCACS unit in an interlaced order.

In MCACS unit 700, three channels of data are stored (being shifted through) shift registers 725 and 726. It will be appreciated that shift registers, among other alternatives, can be used to add, within the limits of physical capacity, any number of channels to a given MCACS (or MCACS). As will also be appreciated, because the data inputs are interlaced in this fashion, the data output by an MCACS unit of the present invention will be similarly interlaced (as shown in FIG. 8 by DATA_OUT).

Example ACSO Circuit and Operation Thereof

It will be appreciated that a technique according to the present invention can be applied in the design of turbo-convolutional decoders, which employ ACSO units, as noted.

Figure 9:
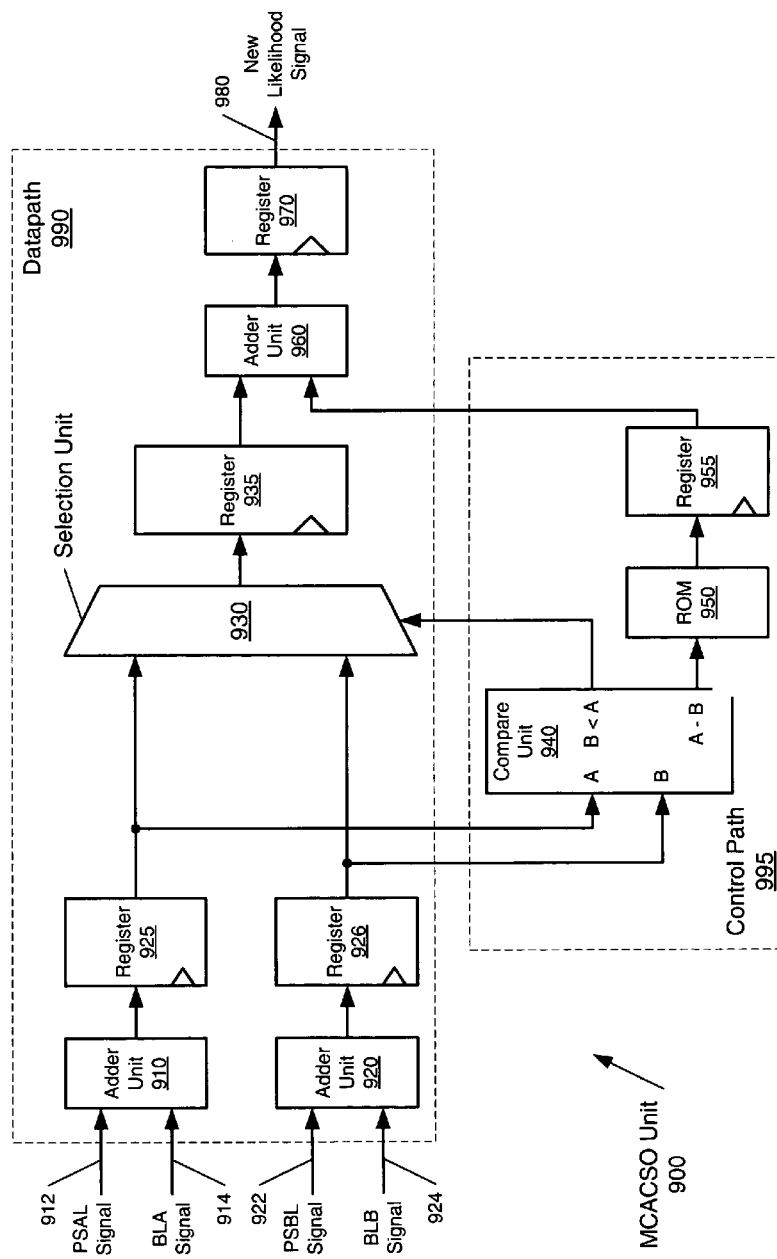
FIG. 9 is a block diagram illustrating an example of an add-compare-select-offset unit according to embodiments of the present invention.

FIG. 9 is a block diagram illustrating an architecture of an MCACSO unit 900 according to the present invention. As will be appreciated, the architecture of MCACSO unit 900 is similar in many respects to that of MCACS unit 400 of FIG. 4. As before, an adder unit 910 takes as its input a PSAC signal 912 and a BCA signal 914, producing a sum of these two signals. Similarly, an adder unit 920 generates the sum of a PSBC signal 922 and a BLB signal 924.

Also as before, these sums are temporarily stored in registers (registers 925 and 926). A selection unit 930 receives these sums from registers 925 and 926. The output of is stored by a register 935. Selection unit 930 selects one of these sums under the control of a compare unit 940, which also receives the sums from registers 925 and 926. Compare unit 940 receives the sum previously generated by adder unit 910 at an input A, and receives the sum previously generated by adder unit 920 at an input B.

Compare unit 940 controls the selection made by selection unit 930 based on a comparison of the inputs A and B. Thus, in one embodiment, the select signal generated by compare unit 940 is based on a determination as to whether the input B is less than the input A (depicted in FIG. 9 as an output B<A). Compare unit 940 is also configured to generate the difference between input A and input B (depicted in FIG. 9 as an output A-B). This difference is provided to a read-only memory (ROM) 950, or other such storage device. ROM 950 stores offsets that provide the offsets necessary to compute the new likelihood ratio. The output of ROM 950 is stored by a register 955.

The output of register 935 (the stored output of selection unit 930) and register 955 are summed by an adder unit 960 to generate a new likelihood value. This new likelihood value is clocked into a register 970, and appears at an output of register 970 as a new likelihood signal 980.

As will be appreciated, adder units 910 and 920, registers 925 and 926, selection unit 930, register 935, adder unit 960 and register 970 make up a datapath 990 of MCACSO unit 900, while compare unit 940, ROM 950 and register 955 make up a control path 995 of MCACSO unit 900. As noted with regard to the MCACS units discussed earlier, in general, clocked storage stages can be inserted into datapath 990 at any point between its inputs and its outputs. This includes inserting clocked storage stages within the outer units, selection unit or in between such elements. This also holds true for the insertion of clocked storage stages within control path 995 (e.g., a clocked storage stage can be inserted within compare unit 940, for example).

However, in the manner previously noted, for each clocked storage stage inserted after the point at which control path 995 is coupled to datapath 990, a clocked storage stage inserted in datapath 990 will mandate the insertion of a corresponding clocked storage stage within control path 995. Ultimately, the need is to provide a given channel's data to the various elements of datapath 990 and control path 995, such that data and control signals are present and stable at corresponding points in datapath 990 and control path 995, and such that the outputs generated thereby are good for a period of time sufficient to allow MCACSO unit 900 to operate properly.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Moreover, while the invention has been particularly shown and described with reference to these specific embodiments, it will be understood by those skilled in the art that the foregoing and other changes in the form and details may be made therein without departing from the spirit or scope of the invention.

What is claimed is:

1. An add-compare-select circuit, comprising:
    an adder circuit to receive first and second sets of cost signals and configured to provide first and second summations of the first and second sets of cost signals;
    a first synchronization circuit, coupled to the adder circuit, the first synchronization circuit configured to store and provide the first and second summations in synchrony with a clock signal;
    a compare circuit to receive the first and second summations in response to the clock signal and configured to provide a comparison signal indicative of a relative difference between a magnitude of the first summation and a magnitude of the second summation;
    a second synchronization circuit, coupled to the first synchronization circuit and the compare circuit, the second synchronization circuit configured to store and provide the first and second summations in synchrony with the clock signal and to store and provide the comparison signal in synchrony with the clock signal; and
    a selection circuit, coupled to the second synchronization circuit, the selection circuit configured to provide a selected signal that is equal to one of the first or second summations in response to a value of the comparison signal.

2. The add-compare-select circuit of claim 1, wherein the adder circuit comprises:
    a first adder unit coupled to receive a first previous cost signal and a first branch cost signal and configured to sum the first previous cost signal and the first branch cost signal to provide the first summation; and
    a second adder unit coupled to receive a second previous cost signal and a second branch cost signal and configured to sum the second previous cost signal and the second branch cost signal to provide the second summation.

3. The add-compare-select circuit of claim 1, wherein the first synchronization circuit comprises:
    a first register to receive the first summation and the clock signal, the first register configured to provide the first summation at an output of the first register in response to a first transition of the clock signal; and
    a second register to receive the second summation and the clock signal, the second register configured to provide the second summation at an output of the second register in response to the first transition of the clock signal.

4. The add-compare-select circuit of claim 3, wherein the compare circuit provides the comparison signal having a first logic value in response to the magnitude of the first summation being larger than the magnitude of the second summation and provides the comparison signal having a second logic value in response to the magnitude of the first summation being smaller than the magnitude of the second summation.

5. The add-compare-select circuit of claim 4, wherein the second synchronization circuit comprises:
a third register to receive the first summation and the clock signal, the third register configured to provide the first summation at an output of the third register in response to a second transition of the clock signal;
a fourth register to receive the second summation and the clock signal, the fourth register configured to provide the second summation at an output of the fourth register in response to the second transition of the clock signal; and
a fifth register to receive the comparison signal and the clock signal, the fifth register configured to provide the comparison signal at an output of the fifth register in response to the second transition of the clock signal.

6. The add-compare-select circuit of claim 5, further comprising a third synchronization circuit, coupled to the second synchronization circuit and the selection circuit, the third synchronization circuit configured to store and provide the selected signal in synchrony with the clock signal and to store and provide the comparison signal in synchrony with the clock signal.

7. The add-compare-select circuit of claim 6, wherein the third synchronization circuit comprises:
a sixth register to receive the selected signal and the clock signal, the sixth register configured to provide the selected signal at an output of the sixth register in response to a third transition of the clock signal; and
a seventh register to receive the comparison signal and the clock signal, the seventh register configured to provide the comparison signal at an output of the seventh register in response to the third transition of the clock signal.

8. An add-compare-select circuit, comprising:
a first adder circuit to receive first and second sets of cost signals and configured to provide first and second summations of the first and second sets of cost signals;
a first synchronization circuit, coupled to the adder circuit, the first synchronization circuit configured to store and provide the first and second summations in synchrony with a clock signal;
a compare circuit to receive the first and second summations in response to the clock signal and configured to provide a first comparison signal indicative of a relative difference between a magnitude of the first summation and a magnitude of the second summation and further configured to provide a second comparison signal indicative of an actual difference between the magnitude of the first summation and the magnitude of the second summation;
a memory device to receive the second comparison signal and configured to provide an offset signal in response to the second comparison signal;
a selection circuit, coupled to the first synchronization circuit and the compare circuit, the selection circuit configured to provide a selected signal equal to one of the first or second summations in response to a value of the first comparison signal; and
a second synchronization circuit, coupled to the selection circuit and the memory device, the second synchronization circuit configured to store and provide the selected and offset signals in synchrony with the clock signal.

9. The add-compare-select circuit of claim 8, further comprising:
a second adder circuit to receive the selected signal and the offset signal and configured to provide a summation of the selected signal and the offset signal; and
a third synchronization circuit, coupled to the second adder circuit, the third synchronization circuit configured to store and provide the summation of the selected signal and the offset signal in synchrony with the clock signal.

10. The add-compare-select circuit of claim 8, wherein the first adder circuit comprises:
a first adder unit to receive a first previous cost signal and a first branch cost signal and configured to sum the first previous cost signal and the first branch cost signal to provide the first summation; and
a second adder unit coupled to receive a second previous cost signal and a second branch cost signal and configured to sum the second previous cost signal and the second branch cost signal to provide the second summation.

11. The add-compare-select circuit of claim 8, wherein the first synchronization circuit comprises:
a first register to receive the first summation and the clock signal, the first register configured to provide the first summation at an output of the first register in response to a first transition of the clock signal; and
a second register to receive the second summation and the clock signal, the second register configured to provide the second summation at an output of the second register in response to the first transition of the clock signal.

12. The add-compare-select circuit of claim 11, wherein the compare circuit provides the first comparison signal having a first logic value in response to the magnitude of the first summation being larger than the magnitude of the second summation and provides the first comparison signal having a second logic value in response to the magnitude of the first summation being smaller than the magnitude of the second summation.

13. The add-compare-select circuit of claim 12, wherein the second synchronization circuit comprises:
a third register to receive the selected signal and the clock signal, the third register configured to provide the selected signal at an output of the third register in response to a second transition of the clock signal; and
a fourth register to receive the offset signal and the clock signal, the fourth register configured to provide the offset signal at an output of the fourth register in response to the second transition of the clock signal.

14. An add-compare-select circuit, comprising:
a first synchronization circuit to receive first and second sets of cost signals and a clock signal, the first synchronization circuit configured to store and provide the first and second sets of cost signals in synchrony with the clock signal;
an adder circuit to receive the first and second sets of cost signals from the first synchronization circuit in response to the clock signal and configured to provide first and second summations of the first and second sets of cost signals;
a second synchronization circuit, coupled to the adder circuit, the second synchronization circuit configured to store and provide the first and second summations in synchrony with the clock signal;
a compare circuit to receive the first and second summations in response to the clock signal and configured to provide a comparison signal indicative of a relative difference between a magnitude of the first summation and a magnitude of the second summation;

a third synchronization circuit, coupled to the second synchronization circuit and the compare circuit, the third synchronization circuit configured to store and provide the first and second summations in synchrony with the clock signal and to store and provide the comparison signal in synchrony with the clock signal; and a selection circuit, coupled to the third synchronization circuit, the selection circuit configured to provide a selected signal equal to one of the first or second summations in response to a value of the comparison signal.

15. The add-compare-select circuit of claim 14, wherein the first synchronization circuit comprises:

a first register to receive a first cost signal and the clock signal, the first register configured to provide the first cost signal at an output of the first register in response to a first transition of the clock signal;

a second register to receive a second cost signal and the clock signal, the second register configured to provide the second cost signal at an output of the second register in response to the first transition of the clock signal;

a third register to receive a third cost signal and the clock signal, the third register configured to provide the third cost signal at an output of the third register in response to the first transition of the clock signal; and a fourth register to receive a fourth cost signal and the clock signal, the fourth register configured to provide the fourth cost signal at an output of the fourth register in response to the first transition of the clock signal.

16. The add-compare-select circuit of claim 15, wherein the adder circuit comprises:

a first adder unit to receive the first and second cost signals in response to the first transition of the clock signal and configured to sum the first and second cost signals to provide the first summation; and a second adder unit to receive the third and fourth cost signals in response to the first transition of the clock signal and configured to sum the third and fourth cost signals to provide the second summation.

17. The add-compare-select circuit of claim 16, wherein the second synchronization circuit comprises:

a fifth register to receive the first summation and the clock signal, the fifth register configured to provide the first summation at an output of the fifth register in response to a second transition of the clock signal; and a sixth register to receive the second summation and the clock signal, the sixth register configured to provide the second summation at an output of the sixth register in response to the second transition of the clock signal.

18. The add-compare-select circuit of claim 17, wherein the fifth register includes a shift register.

19. The add-compare-select circuit of claim 17, wherein the sixth register includes a shift register.

20. The add-compare-select circuit of claim 17, wherein the compare circuit provides the comparison signal having a first logic value in response to the magnitude of the first summation being larger than the magnitude of the second summation and provides the comparison signal having a second logic value in response to the magnitude of the first summation being smaller than the magnitude of the second summation.

21. The add-compare-select circuit of claim 20, wherein the third synchronization circuit comprises:

a seventh register to receive the first summation from the fifth register and coupled to receive the clock signal, the seventh register configured to provide the first summation at an output of the seventh register in response to a third transition of the clock signal;

an eighth register to receive the second summation from the sixth register and to receive the clock signal, the eighth register configured to provide the second summation at an output of the eighth register in response to the third transition of the clock signal; and a ninth register to receive the comparison signal and the clock signal, the ninth register configured to provide the comparison signal at an output of the ninth register in response to the third transition of the clock signal.

22. The add-compare-select circuit of claim 21, further comprising a fourth synchronization circuit comprises:

a tenth register to receive the selected signal and the clock signal, the tenth register configured to provide the selected signal at an output of the tenth register in response to a fourth transition of the clock signal; and an eleventh register to receive the comparison signal and the clock signal, the eleventh register configured to provide the comparison signal at an output of the eleventh register in response to the fourth transition of the clock signal.

* * * * *

UNITED STATES PATENT AND TRADEMARK OFFICE
CERTIFICATE OF CORRECTION

| | | |
|---|---|---|
| PATENT NO. | : 7,613,990 B1 | Page 1 of 1 |
| APPLICATION NO. | : 10/717042 | |
| DATED | : November 3, 2009 | |
| INVENTOR(S) | : Wilkie et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1746 days.

Signed and Sealed this

Nineteenth Day of October, 2010

David J. Kappos
*Director of the United States Patent and Trademark Office*